United States Patent
Falcone et al.

[11] Patent Number: 6,022,583
[45] Date of Patent: Feb. 8, 2000

[54] METHOD OF ENCAPSULATING A WIRE BONDED DIE

[75] Inventors: Frank Falcone, Vista; Alan Lewis, Carlsbad; John Newbold, San Diego, all of Calif.

[73] Assignee: Nordson Corporation, Westlake, Ohio

[21] Appl. No.: 08/991,460

[22] Filed: Dec. 16, 1997

[51] Int. Cl.[7] .............................. B05D 1/26; B05D 5/12
[52] U.S. Cl. ......................... 427/96; 427/256; 427/282; 427/287
[58] Field of Search .................. 427/96, 256, 287, 427/282; 257/788, 793; 264/272.11, 272.15, 272.17

[56] References Cited

U.S. PATENT DOCUMENTS

| | | | |
|---|---|---|---|
| 4,822,550 | 4/1989 | Komathu | 264/263 |
| 4,967,933 | 11/1990 | Maiorca et al. | 222/1 |
| 5,052,338 | 10/1991 | Maiorca et al. | 118/668 |
| 5,110,615 | 5/1992 | Maiorca et al. | 427/8 |
| 5,182,853 | 2/1993 | Kobayashi et al. | 29/841 |
| 5,213,748 | 5/1993 | Biswas et al. | 269/251 |
| 5,266,349 | 11/1993 | Bon | 427/8 |
| 5,320,250 | 6/1994 | La et al. | 222/1 |
| 5,465,879 | 11/1995 | La et al. | 222/189.06 |
| 5,468,999 | 11/1995 | Lin et al. | 257/784 |
| 5,505,777 | 4/1996 | Ciardella et al. | 118/663 |
| 5,577,319 | 11/1996 | Knecht | 29/827 |

OTHER PUBLICATIONS

Carlos E. Bouras and Alec J. Babiarz, Adhesive Dispensing for Flip Chip–on–Board, Electronic Packaging & Production, Oct. 1995.

Alec J. Babiarz, Chip Size Packaging, Advanced Packaging, May/Jun. 1995.

Alec J. Babiarz, Dispensing Processes In Chip Assembly for Direct Chip Attach, Electronic Packaging & Production, Apr. 1995.

, Electronic Packaging & Production® vol. 37, No. 2, Jan. 1997.

A–600 Series Automated Fluid Dispensing Systems, Asymtek® Total Dispensing Solutions, Nov. 1995, 6 pages.

Alec J. Babiarz and Alan Lewis, *Process Notes for Successful Encapsulation and Underfilling in MCM Assembly*, Electronic Packaging & Production, Nov. 1994.

Alec J. Babiarz, Dispensing Epoxy, Advanced Packaging, 1992.

Advanced IC Encapsulation Systems from Asymtek® , *Asymtek® Millennium™ Series*, 8 pages no date.

M–800 Series, *Asymtek® Millennium™ Series*, Feb. 1997, 2 pages.

M–FCOB, *Asymtek® Millennium™ Series*, Nov. 1996, 2 pages.

M–ENCAP, *Asymtek® Millennium™ Series*, Nov. 1996, 2 pages.

Fluidmove for Windows™, *Asymtek® Millennium™ Series*, Nov. 1996, 2 pages.

Material Handling, *Asymtek® Millennium™ Series*, Apr. 1996, 2 pages.

*Primary Examiner*—Fred J. Parker
*Attorney, Agent, or Firm*—Wood, Herron & Evans L.L.P.

[57] ABSTRACT

A method of dispensing encapsulant material on a wire bonded die comprises dispensing a series of discrete, single-point droplets and a series of continuous beads within an area bounded by a dam. The encapsulant material spreads out from the droplets and the continuous beads to form an encapsulating layer over the wire bonded die in an area defined by the dam.

27 Claims, 2 Drawing Sheets

METHOD OF ENCAPSULATING A WIRE BONDED DIE

FIELD OF THE INVENTION

The present invention relates generally to methods of dispensing flowable material on fixed substrates and, more particularly, to a method of dispensing encapsulant material on a wire bonded die.

BACKGROUND OF THE INVENTION

In packaging of wire bonded dies, encapsulation is necessary to protect the integrated circuit die from mechanical stresses and chemical attack which may be encountered in the typical operating environment of the device. Single chip modules, for example, have an integrated circuit die adhesively bonded within a recessed cavity of a carrier substrate. The generally rectangular die includes a series of fine wire bonds that extend from a surface of the die and attach to wire bonding areas located on a surface of the carrier substrate. The wire bonds carry electrical signals between the integrated circuit die and individual contact pads located in the wire bonding areas of the carrier substrate. In the past, encapsulation of a wire bonded die and its carrier substrate, such as a conventional lead frame, was achieved by placing the die and carrier substrate in a mold, and then injecting encapsulant material into the mold through one or more injection gates. The encapsulating material filled the mold cavity to cover the wire bonded die and, after the encapsulant cured and hardened, the mold was removed to reveal a molded encapsulated part.

However, with the increased use in the electronics industry of area array packaging for wire bonded dies, such as ball grid array (BGA) interconnect packages, the increased size of advanced integrated circuit dies, the higher number and tighter spacing of the fine wire bonds, and the overall geometry of the ball grid arrays make molded encapsulation a less desirable process. For these reasons, liquid encapsulation of advanced wire bonded dies with two-part liquid epoxies and the like has become increasingly popular for high volume integrated circuit package applications.

With epoxy-based liquid encapsulation processes, the wire bonded die and carrier substrate are encapsulated with a viscous, self-leveling material that is dispensed from a moving dispensing needle or nozzle located above the part. The dispensing needle is programmed to follow a programmed dispensing path over the wire bonded die to dispense the liquid encapsulant over the part in a predefined pattern. Typically, the dispensing pattern is programmed as a single glob shot, shrinking square, shrinking oval or zigzag for dispensing the encapsulant relatively evenly over the wire bonded die, including the fine wire bonds and wire bonding areas. Each of these known dispensing patterns may further include a rectangular dispense pattern located outside of the initial pattern to further enhance the encapsulation process.

In any encapsulant dispensing process, several critical issues must be addressed, including the elimination of any voids or bubbles in the encapsulant material, the dispensing of the correct volume of encapsulant on the part in an accurate and repeatable manner, and the speed of the encapsulation process. Notwithstanding the advances that have been made in liquid encapsulation of wire bonded dies using area array interconnect packages, there is a need for an encapsulation process that substantially eliminates trapped voids or bubbles in the protective encapsulating layer of an advanced wire bonded die which may lead to premature part failure. There is also a need for an encapsulation process that relatively quickly and evenly dispenses liquid encapsulant in a predefined pattern to provide an overall level encapsulation of advanced wire bonded dies. Additionally, there is also a need for an encapsulation process that provides substantially uniform and repeatable encapsulation of wire bonded dies for high volume integrated circuit packaging applications. Moreover, there is a need for an encapsulation process that permits increased flowrates of encapsulating material to be used which results in a higher volume of parts through the encapsulation process.

SUMMARY OF THE INVENTION

To these ends, in accordance with a preferred method of the present invention, a combination including a wire bonded die mounted on a carrier substrate is encapsulated with liquid encapsulant. The combination of the wire bonded die and carrier substrate includes a trough extending about an outer periphery of the die, and a dam extending about an outer periphery of the tough. Liquid encapsulant material is dispensed in a predetermined pattern within an area bounded by the dam to form an encapsulating layer over the wire bonded die. The dispensing pattern preferably includes a series of discrete, single-point dispensing locations which at least partially overlie a top surface of the die and a series of continuous dispensing lines which at least partially overlie an area defined between the trough and the dam. The liquid encapsulant spreads out from each of the single-point dispensing locations and continuous dispensing lines to fully encapsulate the wire bonded die.

Preferably, the encapsulation method includes forming a droplet of liquid encapsulant at each of the discrete, single-point dispensing locations and a continuous bead of liquid encapsulant along each of the continuous dispensing lines. Each droplet and continuous bead of liquid encapsulant has a predetermined weight at each of the respective dispensing locations and along each of the respective dispensing lines. The liquid encapsulant is preferably dispensed from an outlet of a dispenser which is moved to each of the discrete, single-point dispensing locations and along each of the dispensing lines in a preprogrammed manner under the control of a controller.

With the preferred dispensing pattern of the present invention, an encapsulation process is provided that substantially eliminates trapped voids or bubbles in the protective encapsulating layer over the wire bonded die which may cause early failure of the part. The encapsulation method of the present invention dispenses liquid encapsulant relatively quickly and evenly with increased flowrates to provide an overall level encapsulated part. The method of the present invention further provides substantially uniform and repeatable encapsulation of wire bonded dies for high volume integrated circuit packaging applications.

The above features and advantages of the present invention will be better understood with reference to the accompanying figures and detailed description.

BRIEF DESCRIPTION OF THE DRAWINGS

Reference will now be made to the accompanying figures from which the novel features and advantages of the present invention will be apparent:

FIG. 1A is a diagrammatic cross-sectional view showing one of several discrete, single-point dispensing locations in accordance with the preferred method of encapsulation shown in FIG. 1;

DETAILED DESCRIPTION OF THE PREFERRED EMBODIMENT

Figure 1:
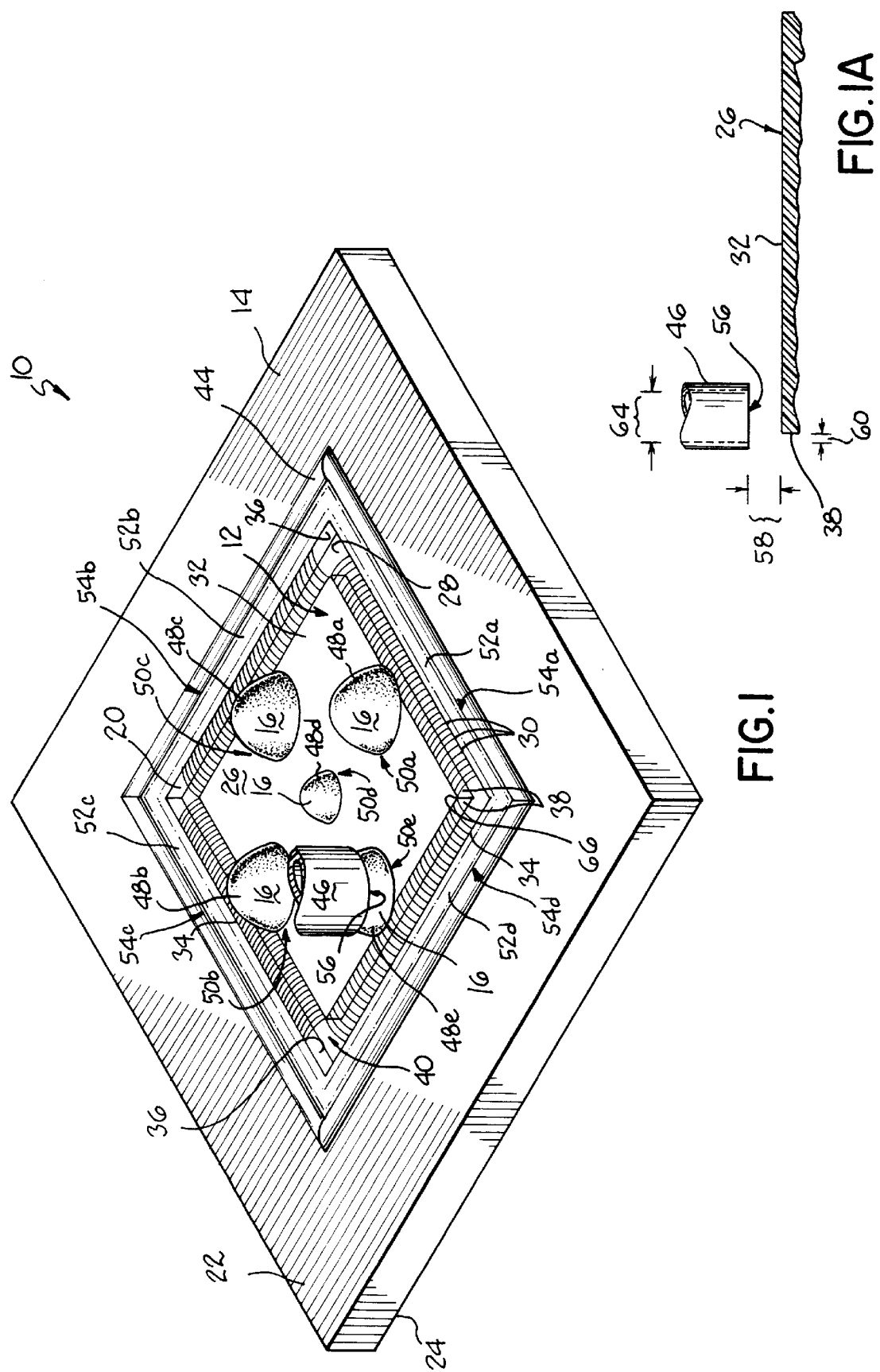
FIG. 1 is a perspective view of a wire bonded die in the process of being encapsulated in accordance with a preferred method of the present invention.

With reference to the figures, and to FIG. 1 in particular, a preferred method of encapsulating a single chip module (SCM) 10 is shown in accordance with the principles of the present invention. The single chip module 10 represents a conventional, packaged advanced integrated circuit which is adapted to be mounted on a printed circuit board (PCB) as a component of an electrical circuit. Single chip module 10 includes a wire bonded die 12 adhesively mounted to a carrier substrate 14. Typically, the carrier substrate 14 is a thin laminate, flexible polyimide or ceramic substrate that is configured in either a cavity-up or cavity-down ball grid array interconnect package, although other types of interconnect packages are also used. As will be described in more detail below, the wire bonded die 12 is encapsulated with a viscous encapsulating material 16 (FIGS. 1 and 2) which is then snap cured to form a hardened, protective encapsulating layer 18 (FIGS. 3 and 4) over the wire bonded die 12. The protective encapsulant layer 18 primarily serves to protect the wire bonded die 12 from mechanical stresses and chemical attack which may be encountered in the operating environment of the single chip module 10, and also secondarily serves to provide a smooth flat surface for silk screening of the device for cavity-up configurations.

As shown in FIG. 1, the carrier substrate 14 includes a generally rectangular cavity 20 which is recessed in the body of the carrier substrate between respective upper and lower surfaces 22 and 24. A generally rectangular integrated circuit die 26 is adhesively bonded to a bottom surface 28 of the cavity 20, and includes a series of wire bonds 30 that extend from a top surface 32 of the die 26 and attach to wire bonding areas 34 located on the upper surface 22 of the carrier substrate 14. As used herein, those skilled in the art will recognize that the terms "upper" and "lower" describe one embodiment of the single chip module 10 in a cavity-up configuration as shown in the figures, and that these terms would be generally reversed to describe a cavity-down single chip module configuration. Thus, the terms "upper", "lower", "top" and "bottom" are used herein solely to describe an exemplary embodiment of the invention and are not to be construed as structural limitations of the invention.

The cavity 20 of carrier substrate 14 is defined by the bottom surface 28 and four generally vertical edges or walls 36 that extend from the bottom surface 28 to the upper surface 22 of the carrier substrate 14. The integrated circuit die 26 has four generally vertical edges or walls 38 about its outer periphery which, in combination with the respective vertical walls 36 and bottom surface 28 of the carrier substrate 14, define a trough 40 extending about the outer periphery of the die 26 as shown most clearly in FIGS. 1, 3 and 4. The wire bonds 30 extend over the trough 40 from the top surface 32 of the die 26 to the wire bonding areas 34 located on the upper surface 22 of carrier substrate 14. As shown most clearly in FIGS. 1 and 3, the wire bonding areas 34 are located about all four edges of the wire bonded die 26 as is conventional in the art. Individual contact pads (not shown) in the wire bonding areas 34, to which the wire bonds 30 are soldered, are electrically coupled to individual ball interconnects 42 (FIG. 4) of the ball grid array. In this way, electrical signal paths are provided between the ball grid array interconnects 42 and the integrated circuit die 26 through the wire bonds 30.

Before the single chip module 10 is encapsulated in accordance with the preferred method of the present invention, a dam 44 is formed extending from the upper surface 22 of the carrier substrate 14 for purposes to be described in more detail below. The dam 44 may be a liquid, cured liquid or mechanical dam in cavity-up or cavity-down configurations. Dam 44 includes four connected segments that are spaced from, and extend generally parallel to the respective vertical walls 36 of cavity 20 about an outer periphery of the trough 40. The dam 44 does not form a part of the present invention per se and may be formed in any manner conventionally known in the integrated circuit packaging art.

Referring to FIG. 1, a preferred method of encapsulating wire bonded die 26 with viscous encapsulant material 16 is shown in accordance with the principles of the present invention. Preferably, the encapsulation process is automated by a programmable and calibrated encapsulant dispensing system (not shown) which dispenses the encapsulant material 16 in a defined pattern and in controlled weight amounts through a dispensing needle 46. A preferred encapsulant dispensing system for use in the present invention is the MILLENIUM™ Series Encapsulation Dispensing System commercially available from Asymtek of Carlsbad, Calif. Briefly, the MILLENIUM™ Series Dispensing System is a precision dispensing system which provides a closed-loop control of key process parameters for in-line integrated circuit package encapsulation. The positioning and movement of dispensing needle 46 in x-y-z planes is fully programmable, and the weight of encapsulant material 16 that is dispensed at each dispensing location is precisely controlled. The operation and programming functions and syntax of the MILLENIUM™ Series Encapsulant Dispensing System are fully described in the MILLENIUM™ Series Operating Manuals and the MILLENIUM™ Series FLUID MOVE FOR WINDOWS™ Programming Manuals which are commercially available from Asymtek and incorporated herein by reference in their entirety. While the MILLENIUM™ Series Encapsulant Dispensing System is a preferred encapsulant dispensing system for use in the present invention, it is contemplated that other automated encapsulant dispensing systems may be used without departing from the spirit and scope of the present invention.

Still referring to FIG. 1, a preferred dispensing pattern for encapsulating wire bonded die 12 in accordance with the present invention is shown. The dispensing needle 46 is programmed to dispense five weight-controlled droplets of encapsulant material 16, shown diagrammatically at 48a–48e, in a predefined sequence that corresponds respectively to five discrete, single point dispensing locations 50a–50e. In particular, dispensing needle 46 is preferably operable to move under programmed control of the automated dispensing system to each of the discrete, single-point dispensing locations 50a–50e, starting at dispensing location 50a and moving successively to each of the dispensing locations 50b–50d before ending at dispensing location 50e.

The dispensing needle 46 is further programmed to dispense four weight-controlled continuous beads of encapsulant material 16, shown diagrammatically at 52a–52d, in a predefined sequence that corresponds respectively to four continuous dispensing lines 54a–54d. Dispensing needle 46 is preferably operable to move under programmed control of the automated dispensing system along each of the continuous dispensing lines 54a–54d, starting at dispensing line 54a and moving successively along each of the dispensing lines 54b–54c before ending along dispensing line 54d. Dispensing needle 46 is preferably a 14 gauge needle which includes a dispensing outlet 56 at a remote end of the needle for dispensing the droplets 48a–48e and continuous beads 52a–52d of encapsulant material 16.

Figure 2:
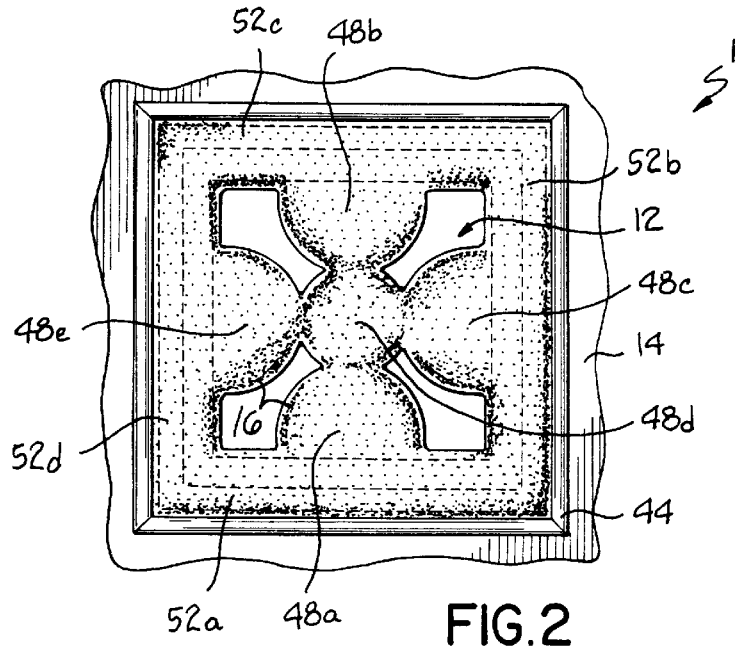
FIG. 2 is a top plan view showing a flow pattern of encapsulant material in accordance with the preferred method of encapsulation shown in FIG. 1.

In one embodiment as shown most clearly in FIG. 1 and 1A, the dispensing outlet 56 of needle 46 is first positioned at dispensing location 50a located above the center of an edge 38 of die 26. The dispensing outlet 56 of needle 46 is positioned a predetermined distance above the top surface 32 of die 26 to define a dispense gap 58. The dispensing outlet 56 of needle 46 is further offset from the edge 38 of die 26 to define an offset 60. At dispensing location 50a, the dispensing system preferably forms the weight-controlled droplet 48a of encapsulant material which then spreads out in a pancake effect and spills over edge 38 of die 26 as shown most clearly in FIG. 2 to aid in the encapsulation process. The same process is preferably repeated at each of the successive discrete, single-point dispensing locations 50b and 50c to form weight-controlled droplets 48b and 48c. At dispensing location 50d, the dispensing outlet 56 of needle 46 is positioned at the dispense gap 58 above the center of die 26 to form weight-controlled droplet 48d. After droplet 48d is formed, the dispensing outlet 56 of needle 46 is positioned at dispensing location 50e, similar to dispensing locations 50a–50c, to form weight-controlled droplet 48e. As shown in FIG. 2, the weight-controlled droplets 48a, 48b, 48c and 48e dispensed at the center of, and offset from, the edges 38 of die 26 primarily serve to displace air and fill the trough 40 with encapsulant material 16, while weight-controlled droplet 48d dispensed at the center of die 26 primarily serves to encapsulate the top surface 32 of the die.

After droplets 48a–48e of encapsulant material have been dispensed, the dispensing outlet 56 of needle 46 is then positioned along dispensing line 54a located within an area defined between trough 40 and dam 44. As shown most clearly in FIG. 1, dispensing line 54a is preferably located adjacent the wire bonding area 34 along one segment of the dam 44. Along dispensing line 54a, the dispensing system preferably forms the weigh-controlled continuous bead 52a of encapsulant material 16 which then spreads out through the wire bonding area 34 as shown most clearly in FIG. 2 to further aid in the encapsulation process. The same process is preferably repeated at each of the successive dispensing lines 54b–54d to form weight-controlled continuous beads 52b–52d. As shown in FIG. 2, the weight-controlled continuous beads 52a–52d primarily serve to displace air and encapsulate the wire bonds 30 in the wire bonding areas 34.

Figure 3:
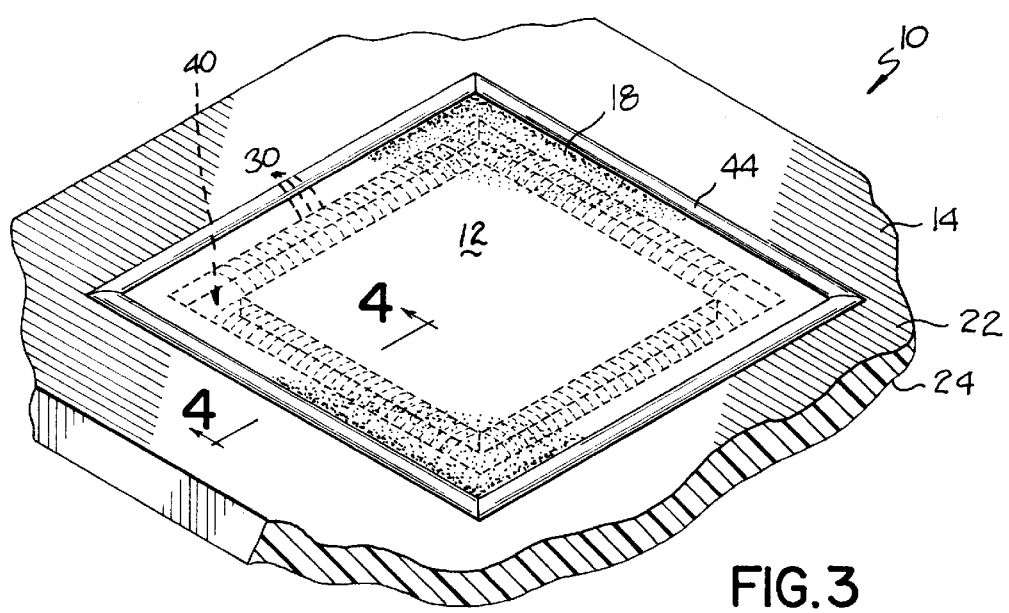
FIG. 3 is a perspective view of a wire bonded die encapsulated in accordance with the preferred method of the present invention.
Figure 4:
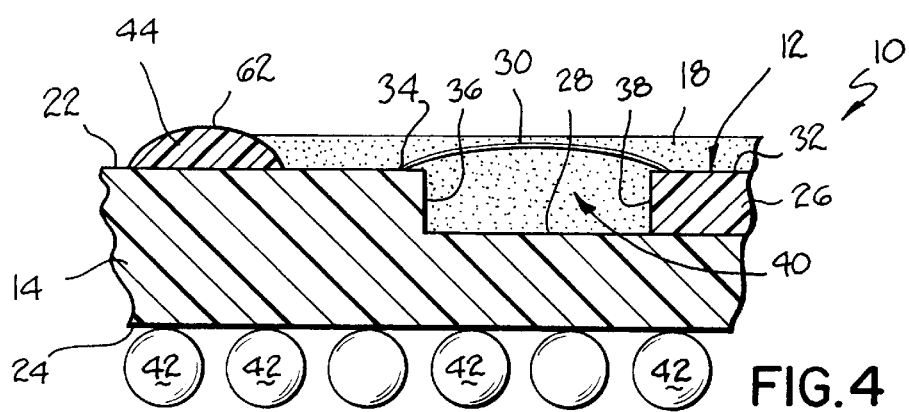
FIG. 4 is a cross-sectional view of the encapsulated wire bonded die taken along line 4—4 in FIG. 3.

Referring now to FIGS. 2–4, as the viscous encapsulant material 16 spreads out from each of the droplets 48a–48e and the continuous beads 52a–52d, the encapsulant covers the wire bonded die 12 and carrier substrate 14 within the area bounded by dam 44. As shown in FIG. 4, the liquid encapsulant is then snap cured to form the protective, hardened encapsulant layer 18 above the wire bonded die 12 and below an apex 62 of the dam 44.

OPERATING EXAMPLE

An integrated circuit die 26 having a top surface 32 with a dimension of about 9/16"9/16" was adhesively bonded in cavity 20 and wire bonded to carrier substrate 14 as shown in FIGS. 1 and 3. A dam 44 was formed on upper surface 22 of carrier substrate 14 with opposite segments of the dam 44 spaced about 13/16" apart. A MILLENIUM™ Series Encapsulation Dispensing System and Model DP 2144 Precision Dispensing Pump, both commercially available from Asymtek of Carlsbad, Calif., were used in the encapsulation process. The liquid encapsulation used in the dispensing process was HYSOL FP 4450 from Dexter which was dispensed from a 14 gauge dispensing needle 46 having an inner diameter 64 (FIG. 4) of about 0.060". The carrier substrate 14 was heated to about 120° C. and the dispensing needle 46 was heated to about 100° C. Fluid pressure was set to about 12 PSI and the valve pressure was set to about 58 PSI.

To dispense droplets 48a–48e as described in detail above, the dispense gap 58 (FIG. 4) was set to about one-half (½) of the dispensing needle inner diameter 64 (FIG. 4). For each of droplets 48a, 48b, 48c and 48e, the offset 60 (FIG. 4) was set to about one-fourth (¼) of the dispensing needle inner diameter 64. For each of droplets 48a, 48b, 48c and 48e, about 32 mg. of liquid encapsulant 16 was dispensed at each of the respective discrete, single-point dispensing locations 50a, 50b, 50c and 50e. For the droplet 48d, about 12 mg. of liquid encapsulant 16 was dispensed at the discrete, single-point dispensing location 50d. Using a reference point 66 at a corner of integrated circuit die 26, the MILLENIUM™ Series Encapsulation Dispensing System was programmed using the MILLENIUM™ Series FLUID MOVE FOR WINDOWS™ software using the following programming parameters:

Droplet 48a: Pot: 1,32.000 (0.262, 0.060)

Droplet 48b: Pot: 1, 32.000 (0.262, 0.490)

Droplet 48c: Pot: 1, 32.000 (0.490, 0.262)

Droplet 48d: Pot: 1, 12.000 (0.262, 0.262)

Droplet 48e: Pot: 1, 32.000 (0.060, 0.262)

To dispense continuous beads 52a–52d as described in detail above, the dispense gap 58 (FIG. 4) was set to about one-half (½) of the dispensing needle inner diameter 64 (FIG. 4). For each of the continuous beads 52a–52d, about 32 mg. to about 36 mg. of liquid encapsulant 16 was dispensed at each of the respective dispensing lines 54a–54d. Using the reference point 66 at the corner of integrated circuit die 26, the MILLENIUM™ Series Encapsulation Dispensing System was programmed using the MILLENIUM™ Series FLUID MOVE FOR WINDOWS™ software using the following programming parameters:

Continuous Bead 52a: Wt. Conti. Lne. 36.000 1 (−0.081, −0.078) (0.597, −0.078)

Continuous Bead 52b: Wt. Conti. Lne. 34.000 2 (0.597, −0.078) (0.597, 0.560)

Continuous Bead 52c: Wt. Conti. Lne. 32.000 3 (0.597, 0.570) (−0.081, 0.570)

Continuous Bead 52d: Wt. Conti. Lne. 34.000 4 (−0.081, 0.560) (−0.081, −0.078)

Further, using the MILLENIUM™ Series FLUID MOVE FOR WINDOWS™ software, the line parameters for continuous beads 52a–52d were programmed as follows:

|  | Bead 52a | Bead 52b | Bead 52c | Bead 52d |
| --- | --- | --- | --- | --- |
| Pre-Move Delay | .020 | .010 | .000 | .000 |
| Shut-Off Distance | .150 | .160 | .160 | .150 |
| Dispense Gap | .030 | .030 | .030 | .030 |
| Line Speed | .150 | .140 | .130 | .120 |
| Dwell | .000 | .000 | .000 | .000 |
| Retract Distance | .000 | .000 | .000 | .020 |
| Back Track Gap | .050 | .050 | .050 | .020 |
| Back Track Length | .000 | .000 | .000 | .300 |
| Dispensing Speed | 2.00 | 2.00 | 2.00 | 2.00 |
| Dispensing Acceleration | 300 | 300 | 300 | 300 |
| Retract Speed | 2.00 | 2.00 | 2.00 | 2.00 |
| Retract Acceleration | 300 | 300 | 300 | 300 |
| Suck Back | 0 | 0 | 0 | 0 |

Using the FLUID MOVE FOR WINDOWS™ programming parameters set forth above to dispense liquid encapsulant 16 on wire bonded die 12 and carrier substrate 14, it was observed that the weight-controlled droplets 48a, 48b, 48c and 48e at the center of, and offset from, the edges 38 of die 26 primarily spread out as shown in FIG. 2 to displace air and fill trough 40, while weight-controlled droplet 48d at the center of die 26 primarily spread out to encapsulate the top surface 32 of the die. It was further observed that the weight-controlled continuous beads 52a–52d primarily spread out as shown in FIG. 2 to displace air and encapsulate the wire bonds 30. As the viscous encapsulant material 16 spread out from each of the droplets 48a–48e and the continuous beads 52a–52d, it was observed that the encapsulant 16 covered the wire bonded die 12 and carrier substrate 14 within the area bounded by dam 44 without overflowing apex 62 of the dam 44. The encapsulating material 16 was then snap cured to form the hardened, protective encapsulating layer 18 shown in FIG. 4.

It is contemplated that in accordance with the preferred encapsulation method of the present invention, the flowrate of the liquid encapsulant 16 can be raised to over about 500 mg/sec to provide a part throughput exceeding about 450 units/hr through the encapsulation process.

Those skilled in the art will appreciate that the preferred method of encapsulating wire bonded die 12 in accordance with the present invention substantially eliminates trapped voids or bubbles in the protective encapsulating layer 18 which may lead to premature part failure. The preferred encapsulating method of the present invention ensures that the liquid encapsulant 16 is quickly and evenly dispensed to provide an overall level encapsulation of wire bonded die 12 without overflowing dam 44. Additionally, the encapsulation method of the present invention provides substantially uniform and repeatable encapsulation of wire bonded die 12 in both cavity-up and cavity-down configurations for high volume integrated circuit packaging applications. Moreover, the preferred encapsulation method of the present invention permits a higher flowrate of encapsulating material to be used which results in a higher volume of parts through the encapsulation process.

From the above disclosure of the general principles of the present invention and the preceding detailed description of preferred embodiments, those skilled in the will art readily comprehend the various modifications to which the present invention is susceptible. For example, while the droplets 48a–48e and continuous beads 52a–52d of encapsulant material 16 are preferably dispensed in the order and weights described in detail above with reference to one embodiment, it is contemplated that the order of the dispensing pattern and the dispensed weights may be modified without departing from spirit or scope of the present invention. Moreover, when using the preferred encapsulation method of the present invention on parts with different dimensions, some adjustments to the dispensed weights and positioning of droplets 48a–48e and continuous beads 52a–52d may be required. For example, when the liquid encapsulant 16 overflows dam 44 in a corner, the continuous beads should be shortened in the offending corner. When the liquid encapsulant 16 does not flow out to center edges of dam 44, the nearest droplet should be moved away from the offending edge of the dam. If this adjustment fails to address the problem, the dispensed weight of the nearest droplet should be reduced and the weight of center droplet 48d should be increased proportionately. The invention in its broader aspects is therefore not limited to the specific details and illustrative example shown and described. Accordingly, departures may be made from such details without departing from the spirit or scope of Applicants' general inventive concept.

Having described the invention, We claim:

1. A method of encapsulating a wire bonded die mounted on a carrier substrate, said carrier substrate and wire bonded die having a dam extending about said wire bonded die, comprising the steps of:

sequentially dispensing liquid encapsulant material in a predetermined two-dimensional pattern in a plane generally parallel to said wire bonded die and within an area bounded by said dam from a single dispensing outlet, said pattern including a plurality of discrete, single-point dispensing locations; and allowing said liquid encapsulant material to spread out and coalesce to form a generally uniform encapsulating layer over said wire bonded die and within said dam.

2. The method of claim 1 wherein said dispensing step further comprises forming a droplet of liquid encapsulant material at each of said discrete, single-point dispensing locations.

3. The method of claim 1 wherein each of said droplets has a predetermined weight of liquid encapsulant material at each of said discrete, single-point dispensing locations.

4. The method of claim 1 wherein said dispensing step further comprises moving said dispensing outlet to each of said plurality of discrete, single-point dispensing locations in a preprogrammed manner under the control of a controller.

5. The method of claim 1 wherein said dispensing step further comprises moving said dispensing outlet to each of said plurality of discrete, single-point dispensing locations which at least partially overlie a top surface of said wire bonded die.

6. The method of claim 1 wherein said dispensing step further comprises positioning said dispensing outlet at a predetermined distance above a top surface of said wire bonded die at each of said discrete, single-point dispensing locations.

7. A method of encapsulating a wire bonded die mounted on a carrier substrate, said carrier substrate and wire bonded die having a trough extending about an outer periphery of said wire bonded die and a dam extending about an outer periphery of said trough, comprising the steps of:

sequentially dispensing liquid encapsulant material in a predetermined two-dimensional pattern in a plane generally parallel to said wire bonded die and within an area bounded by said dam, said pattern including a plurality of discrete, single-point dispensing locations and a plurality of continuous dispensing lines surrounding said single-point dispensing locations; and allowing said liquid encapsulant material to spread out and coalesce to form a generally uniform encapsulating layer over said wire bonded die and within said dam.

8. The method of claim 7 wherein said dispensing step further comprises forming a droplet of liquid encapsulant material at each of said discrete, single-point dispensing locations.

9. The method of claim 8 wherein each of said droplets has a predetermined weight of liquid encapsulant material at each of said discrete, single-point dispensing locations.

10. The method of claim 7 wherein said dispensing step further comprises forming an elongated continuous bead of liquid encapsulant material along each of said continuous dispensing lines.

11. The method of claim 10 wherein each of said elongated continuous beads has a predetermined weight of liquid encapsulant material along each of said continuous dispensing lines.

12. The method of claim 7 wherein said dispensing step further comprises moving an outlet of a dispenser to each of said plurality of discrete, single-point dispensing locations and along said plurality of continuous dispensing lines in a preprogrammed manner under the control of a controller.

13. The method of claim 7 wherein said dispensing step further comprises moving an outlet of a dispenser to each of said plurality of discrete, single-point dispensing locations which at least partially overlie a top surface of said wire bonded die.

14. The method of claim 7 wherein said dispensing step further comprises moving an outlet of a dispenser along said plurality of continuous dispensing lines which at least partially overlie an area defined between said trough and said dam.

15. The method of claim 7 wherein said dispensing step further comprises positioning an outlet of a dispenser a predetermined distance above a top surface of said wire bonded die at each of said discrete, single-point dispensing locations.

16. The method of claim 7 wherein said dispensing step further comprises positioning an outlet of a dispenser at a predetermined distance above a top surface of said wire bonded die at each of said discrete, single-point dispensing locations.

17. A method of encapsulating a wire bonded die mounted on a carrier substrate, said carrier substrate and wire bonded die having a trough extending about an outer periphery of said wire bonded die and a dam extending about an outer periphery of said trough, comprising the steps of:

sequentially dispensing liquid encapsulant material in a predetermined two-dimensional pattern in a plane generally parallel to said wire bonded die and within an area bounded by said dam, said pattern comprising a plurality of discrete, single-point dispensing locations which at least partially overlie a top surface of said die and a plurality of continuous dispensing lines surrounding said single-point dispensing locations which at least partially overlie an area defined between said trough and said dam; and allowing said liquid encapsulant material to spread out and coalesce to form a generally uniform encapsulating layer over said wire bonded die and within said dam.

18. The method of claim 17 wherein said dispensing step further comprises forming a droplet of liquid encapsulant material at each of said discrete, single-point dispensing locations.

19. The method of claim 18 wherein each of said droplets has a predetermined weight of liquid encapsulant material at each of said discrete, single-point dispensing locations.

20. The method of claim 17 wherein said dispensing step further comprises forming an elongated continuous bead of liquid encapsulant material along each of said continuous dispensing lines.

21. The method of claim 20 wherein each of said elongated continuous beads has a predetermined weight of liquid encapsulant material along each of said continuous dispensing lines.

22. The method of claim 17 wherein said dispensing step further comprises moving an outlet of a dispenser to each of said plurality of discrete, single-point dispensing locations and along said plurality of continuous dispensing lines in a preprogrammed manner under the control of a controller.

23. A method of encapsulating a wire bonded die, comprising:

dispensing liquid encapsulant material in a plurality of discrete, single-point droplets in a manner to at least partially contact a top surface of a wire bonding die;

dispensing liquid encapsulant material in a plurality of elongated continuous beads surrounding the single-point droplets; and allowing said liquid encapsulant material to spread out and form an encapsulating layer over said wire bonded die.

24. The method of claim 23 wherein each of said discrete, single-point droplets has a predetermined weight of liquid encapsulant material.

25. The method of claim 23 wherein each of said elongated continuous beads has a predetermined weight of liquid encapsulant material.

26. The method of claim 23 wherein said dispensing step further comprises moving an outlet of a dispenser in a preprogrammed manner under the control of a controller to form said plurality of discrete, single-point droplets and said plurality of elongated continuous beads.

27. The method of claim 23 wherein said dispensing step further comprises positioning an outlet of a dispenser at a predetermined distance above a top surface of said wire bonded die at each of said discrete, single-point dispensing locations.

* * * * *